(12) United States Patent
Lee et al.

(10) Patent No.: US 9,692,012 B2
(45) Date of Patent: Jun. 27, 2017

(54) ORGANIC LIGHT EMITTING DISPLAY DEVICE AND METHOD OF MANUFACTURING THE SAME

(71) Applicant: Samsung Display Co., LTD., Yongin, Gyeonggi-Do (KR)

(72) Inventors: Eun-Jung Lee, Seongnam-si (KR); Seung-Bae Lee, Seoul (KR); Byeong-Hwa Choi, Seoul (KR); Hak-Sun Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 290 days.

(21) Appl. No.: 14/519,518

(22) Filed: Oct. 21, 2014

(65) Prior Publication Data

US 2015/0129851 A1    May 14, 2015

(30) Foreign Application Priority Data

Nov. 11, 2013   (KR) .................. 10-2013-0135989

(51) Int. Cl.
*H01L 29/08* (2006.01)
*H01L 35/24* (2006.01)
(Continued)

(52) U.S. Cl.
CPC ........ *H01L 51/5262* (2013.01); *H01L 27/322* (2013.01); *H01L 27/3211* (2013.01);
(Continued)

(58) Field of Classification Search
CPC ............. H01L 51/5262; H01L 27/3244; H01L 27/3211; H01L 27/322; H01L 2251/5315; H01L 51/524
See application file for complete search history.

(56) References Cited

U.S. PATENT DOCUMENTS 7,535,171 B2    5/2009 Bernkopf
7,602,118 B2 *  10/2009 Cok .................... H01L 51/5268
                                             313/504
(Continued)

OTHER PUBLICATIONS

Kim, et al., Effective Material Property Extraction of a Metamaterial by Taking Boundary Effects Into Account at TE/TM Polarized Incidence, Progress in Electromagnetics Research B, vol. 36, pp. 1-33, 2012.

*Primary Examiner* — Stephen W Smoot
*Assistant Examiner* — Vicki B Booker
(74) *Attorney, Agent, or Firm* — Cantor Colburn LLP

(57) ABSTRACT

An organic light emitting display device includes a first substrate, a thin film transistor disposed on the first substrate, a first electrode electrically coupled to the thin film transistor, a pixel defining layer disposed on the first substrate and the first electrode to define unit pixels, a plurality of organic light emitting structure disposed on the first electrode, where in the organic light emitting structure includes a first organic light emitting structure, a second organic light emitting structure and a third light emitting structure, a second electrode which covers the first through third organic light emitting structures and the pixel defining layer; a metamaterial layer disposed on the second electrode corresponding to the organic light emitting structures, an encapsulation member which covers the second electrode and the metamaterial layer, and a second substrate disposed on the encapsulation member opposite to the first substrate.

13 Claims, 10 Drawing Sheets

(51) Int. Cl.
*H01L 51/00* (2006.01)
*H01L 51/52* (2006.01)
*H01L 27/32* (2006.01)

(52) U.S. Cl.
CPC ........ *H01L 27/3244* (2013.01); *H01L 51/524* (2013.01); *H01L 2251/5315* (2013.01)

(56) References Cited

U.S. PATENT DOCUMENTS

| | | |
|---|---|---|
| 9,590,204 B2 * | 3/2017 | Kobayashi .......... H01L 51/5092 |
| 2013/0119236 A1 | 5/2013 | Lenchenkov |
| 2014/0299359 A1 * | 10/2014 | Mittal ............. H01L 31/022466 174/251 |
| 2015/0194618 A1 * | 7/2015 | Cheng .................... H01L 21/77 257/40 |

* cited by examiner

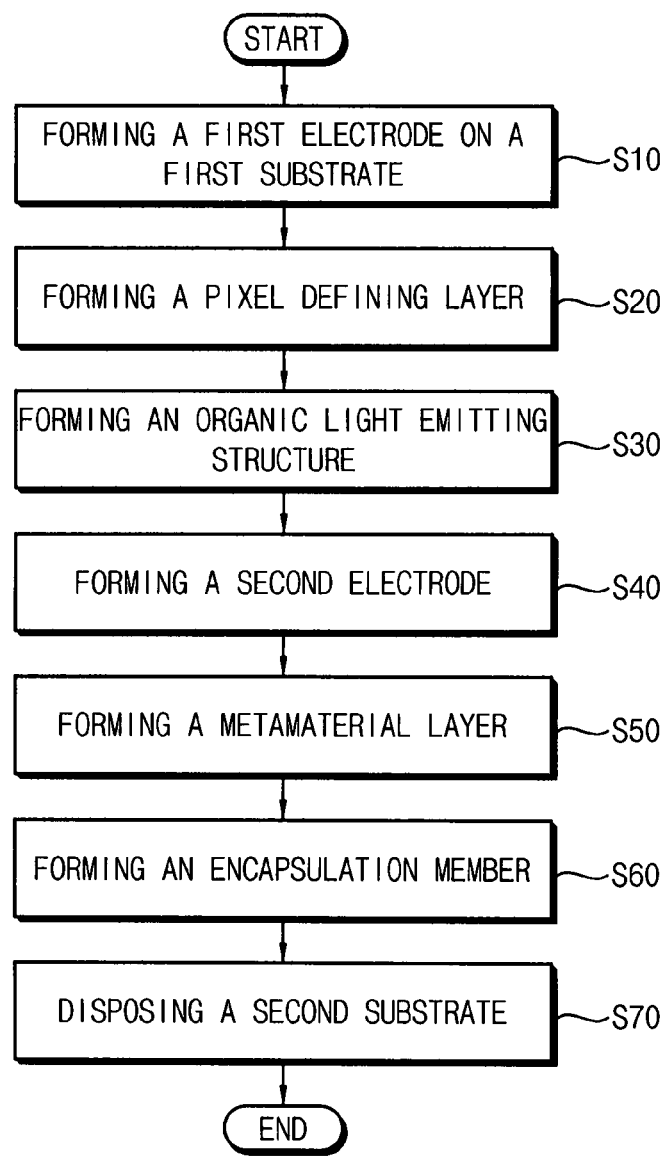

ORGANIC LIGHT EMITTING DISPLAY DEVICE AND METHOD OF MANUFACTURING THE SAME

This application claims priority to Korean Patent Applications No. 10-2013-0135989, filed on Nov. 11, 2013, and all the benefits accruing therefrom under 35 U.S.C. §119, the contents of which in its entirety is herein incorporated by reference.

BACKGROUND

1. Field

Exemplary embodiments relate generally to a display device. More particularly, exemplary embodiments of the invention relate to an organic light emitting display device and method of manufacturing the organic light emitting display device.

2. Description of the Related Art

An organic light emitting display ("OLED") device displays information of images or characters using light generated when holes and electrons that are provided from an anode and a cathode, respectively are combined with each other at an organic light emitting layer interposed between the anode and the cathode. The OLED device has been spotlighted as one of the next-generation display devices due to various characteristics of the OLED device such as a wide viewing angle, a rapid response speed, a thin thickness and low power consumption, for example.

Generally, one of the anode and the cathode of the OLED device may be a reflective electrode, and the other of the anode and the cathode may be as a transparent electrode. However, in an OLED device, the transparent electrode may not be fully transparent to cause resonance of light between the anode and the cathode to increase a light emission efficiency of the organic light emitting display. In such an OLED device, there is a light loss at the transparent electrode that is not fully transparent when light is emitted through the transparent electrode. Accordingly, there is a limitation of increasing the light emission efficiency using the transparent electrode.

SUMMARY

Some exemplary embodiments provide an organic light emitting display device with increased light emission efficiency.

Some exemplary embodiments provide a method of manufacturing the organic light emitting display device.

According to some exemplary embodiments, an organic light emitting display device includes a first substrate, a thin film transistor disposed on the first substrate, a first electrode electrically coupled to the thin film transistor, a pixel defining layer disposed on the first substrate and the first electrode to define unit pixels, a plurality of organic light emitting structure disposed on the first electrode, where the organic light emitting structure includes a first organic light emitting structure, a second organic light emitting structure and a third light emitting structure, a second electrode which covers the first through third organic light emitting structures and the pixel defining layer, a metamaterial layer disposed on the second electrode corresponding to the first through third organic light emitting structures, an encapsulation member which covers the second electrode and the metamaterial layer, and a second substrate disposed on the encapsulation member opposite to the first substrate.

In exemplary embodiments, the metamaterial layer may include a first layer disposed corresponding to the first organic light emitting structure.

In exemplary embodiments, the first organic light emitting structure may emit light having a predetermined wavelength, and the first layer may amplify an intensity of the light having the predetermined wavelength.

In exemplary embodiments, the light having the predetermined wavelength may be one of a red color light, a green color light, and a blue color light.

In exemplary embodiments, the metamaterial layer may further include a second metamaterial layer disposed corresponding to the second organic light emitting structure.

In exemplary embodiments, the metamaterial layer may include a first layer disposed corresponding to the first organic light emitting structure, a second layer disposed corresponding to the second organic light emitting structure, and a third layer disposed corresponding to the third organic light emitting structure.

In exemplary embodiments, the first through third organic light emitting structures respectively may emit first through third lights having a same wavelength as each other, and the first layer may convert the first light having the same wavelength into a red color light, the second layer may convert the second light having the same wavelength into a green color light, and the third layer may convert the third light having the same wavelength into a blue color light.

In exemplary embodiments, each of the first through third lights having the same wavelength may be a white color light.

In exemplary embodiments, the first organic light emitting structure may emit a red color light, the second organic light emitting structure may emit a green color light, the third organic light emitting structure may emit a blue color light, the first metamaterial layer may amplify an intensity of the red color light, the second metamaterial layer may amplify an intensity of the green color light, and the third metamaterial layer may amplify an intensity of the blue color light.

In exemplary embodiments, the metamaterial layer may include a dielectric layer, a plurality of nano wires disposed in the dielectric layer, where the nano wires penetrate the dielectric layer, and the nano wires are arranged at a regular interval, and a coating layer disposed between the nano wires and the dielectric layer.

In exemplary embodiments, the dielectric layer may include silicon dioxide, polymethylmethacrylate, polycarbonate, polyethyleneterephthalate or a combination thereof In exemplary embodiments, the nano wires may include graphene, graphene oxide or a combination thereof.

In exemplary embodiments, the coating layer may argentums, aurum, aluminum, copper, nickel, platinum, titanium or a combination thereof.

According to some exemplary embodiments, a method of manufacturing an organic light emitting display device may include providing a first electrode on a first substrate, providing a pixel defining layer on the first substrate and the first electrode to define unit pixels, providing a first organic light emitting structure, a second organic light emitting structure and a third organic light emitting structure on the first electrode, providing a second electrode to cover the first through third organic light emitting structures and the pixel defining layer, providing a metamaterial layer on the second electrode corresponding to the first through third organic light emitting structures, providing an encapsulation member to cover the second electrode and the metamaterial, and providing a second substrate on the encapsulation member opposite to the first.

In exemplary embodiments, providing the metamaterial layer may providing a first layer of the metamaterial layer corresponding to the first organic emitting structure, providing a second layer of the metamaterial layer corresponding to the second organic emitting structure, and providing a third layer of the metamaterial layer corresponding to the third organic emitting structure.

In exemplary embodiments, the first through third organic light emitting structures respectively may emit first through third lights having a same wavelength as each other, and the first layer may convert the first light having the same wavelength into a red color light, the second layer may convert the second light having the same wavelength into a green color light, and the third layer may convert the third light having the same wavelength into a blue color light.

In exemplary embodiments, each of the first through third lights having the same wavelength may be a white color light.

In exemplary embodiments, the first organic light emitting structure may emit a red color light, the second organic light emitting structure may emit a green color light, the third organic light emitting structure may emit a blue color light, the first metamaterial layer may amplify an intensity of the red color light, the second metamaterial layer may amplify an intensity of the green color light, and the third metamaterial layer may amplify an intensity of the blue color light.

In exemplary embodiments, providing the metamaterial layer may include providing a dielectric layer, providing a plurality of nano wires in the dielectric layer, where the nano wires penetrate the dielectric layer in a thickness direction thereof, and the nano wires are arranged at a regular interval, and providing a coating layer between the nano wires and the dielectric.

In exemplary embodiments as described herein, an organic light emitting display device and a method of manufacturing the organic light emitting display device may improve (i.e., increase) light emission efficiency of the organic light emitting display device by providing a metamaterial layer on the organic light emitting structure.

BRIEF DESCRIPTION OF THE DRAWINGS

The above and other features of the invention will become more apparent by describing in detailed exemplary embodiments thereof with reference to the accompanying drawings, in which:

FIG. 8 is a flowchart illustrating an exemplary embodiment of a method of manufacturing an organic light emitting display device, according to the invention.

DETAILED DESCRIPTION

Figure 1:
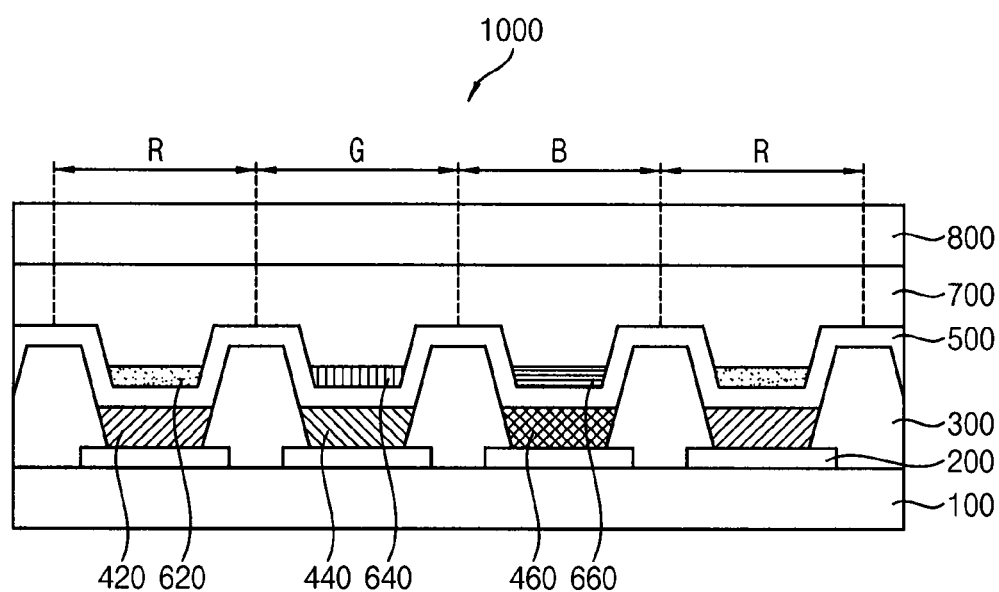
FIG. 1 is cross-sectional view illustrating an exemplary embodiment of an organic light emitting display device, according to the invention.

The invention will be described more fully hereinafter with reference to the accompanying drawings, in which various exemplary embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting. As used herein, the singular forms "a," "an" and "the" are intended to include the plural forms, including "at least one,", unless the context clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

Figure 2:
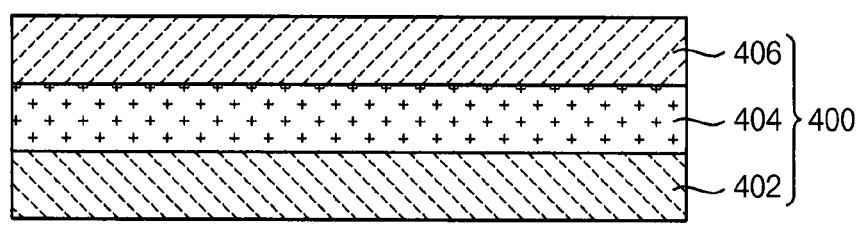
FIG. 2 is a cross-sectional view illustrating an exemplary embodiment of an organic light emitting structure of FIG. 1.

FIG. 1 is cross-sectional view illustrating an exemplary embodiment of an organic light emitting display device, according to the invention, FIG. 2 is a cross-sectional view illustrating an exemplary embodiment of an organic light emitting structure of FIG. 1, and FIG. 3A through 3C are graphs for describing a change of light intensity by a metamaterial layer of FIG. 1.

Referring to FIG. 1, an exemplary embodiment of an organic light emitting display device 1000 may include a first substrate 100, a first electrode 200, a pixel defining layer 300, a plurality of organic light emitting structures, e.g., first through third organic light emitting structures 420, 440 and 460, a second electrode 500, a metamaterial layer including first through third layers 620, 640 and 660, an encapsulation member 700, and a second substrate 800. Hereinafter, the first to third layers of the metamaterial layer may be referred to as first to third metamaterial layers.

In an exemplary embodiment, as shown in FIG. 1, the organic light emitting display device 1000 may include the first through third organic light emitting structures 420, 440 and 460. In some exemplary embodiments, a metamaterial layer is disposed on an organic light emitting structure on the second electrode 500. In one exemplary embodiment, for example, the first to third metamaterial layer 620, 640 and 660 may be disposed on the second electrode 500 corresponding to the first through third organic light emitting structures 420, 440 and 460, respectively. The metamaterial layer 620, 640 and 660 may improve (e.g., increase) light emission efficiency of the organic light emitting display device 1000 by amplifying an intensity of light emitted from the first through third organic light emitting structures 420, 440 and 460 at a predetermined or desired wavelength.

The first substrate 100 may include a transparent insulation substrate. In one exemplary embodiment, for example, the first substrate 100 may be a glass substrate, a quartz substrate or a transparent plastic substrate. In some exemplary embodiments, the first substrate 100 may be a flexible substrate. A plurality of transistors and capacitors may be disposed on the first substrate 100, and the first electrode 200 may be electrically coupled to the transistors. In one exemplary embodiment, for example, the first electrode 200 may be a transparent electrode or a semi-transparent electrode.

The pixel defining layer 300 that defines unit pixels may be disposed on the first substrate 100 and the first electrode 200. The pixel defining layer 300 may include various insulation materials. In such an embodiment, openings that expose some portions of the first electrode 200 may be defined through the pixel defining layer 300.

The first organic light emitting structure 420, the second organic light emitting structure 440 and the third light emitting structure 460 may be disposed on the exposed portions of the first electrode 200 through the pixel defining layer 300. In some exemplary embodiments, the first organic light emitting structure 420, the second organic light emitting structure 440 and the third organic light emitting structure 460 may emit light that have predetermined wavelengths. In one exemplary embodiment, for example, the first organic light emitting structure 420 may emit a red color light, the second organic light emitting structure 440 may emit a green color light, and the third light emitting structure 460 may emit a blue color light. In an exemplary embodiment, as illustrated in FIG. 2, each organic light emitting structure 400 may include a hole transfer layer 402, an organic light emitting layer 404 and an electron injection layer 406. The organic light emitting layer 404 of the first organic emitting structure 420 may include an organic light emitting material that emits the red color light. The organic light emitting layer 404 of the second organic emitting structure 440 may include an organic light emitting material that emits the green color light. The organic light emitting layer 404 of the third organic emitting structure 460 may include an organic light emitting material that emits the blue color light. The hole transfer layer 402 may receive a hole from the second electrode 200, and may transfer the hole to the organic light emitting layer 404. Each organic light emitting structure 400 may further include a hole injection layer and an electron transfer layer.

The second electrode 500 may cover the pixel defining layer 300 and the first through third organic light emitting structures 420, 440 and 460. In one exemplary embodiment, for example, the second electrode 500 may be the transparent electrode or the semi-transparent electrode.

Figure 3A:
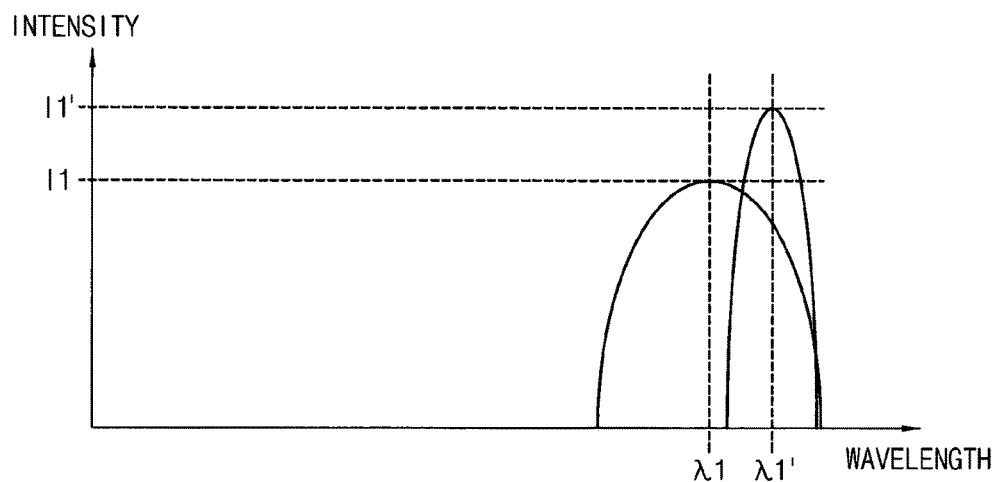
FIG. 3A through 3C are graphs for describing a change of light intensity by a metamaterial layer of FIG. 1.

The first through third metamaterial layers (or the first through third layers of the metamaterial layer) 620, 640, 660 may be disposed on the second electrode 500 corresponding to the first through third organic light emitting structures 420, 440 and 460. In one exemplary embodiment, for example, the first metamaterial layer 620 may be disposed corresponding to (e.g., overlapping) the first organic light emitting structure 420. In some exemplary embodiments, the first organic light emitting structure 420 may emit light that has a predetermined wavelength. The first metamaterial layer 620 may amplify an intensity of the light from the first organic light emitting structure 420. In one exemplary embodiment, for example, the first metamaterial layer 620 may emit the red color light, and may amplify an intensity of the red color light. As illustrated in FIG. 3A, the first organic light emitting structure 420 may emit the red color light that has a first light intensity I1 at a first wavelength λ1. The red color light having the first light intensity I1 at the first wavelength λ1 may be converted into the red color light having a converted (e.g., increased or improved) first light intensity I1' at an adjusted first wavelength λ1' by a resonance in the first metamaterial layer 620. Thus, in an exemplary embodiment, a red color coordinate of the organic light emitting display device 1000 may be compensated by adjusting the wavelength of the red color light and by decreasing a wavelength range of the red color light. In such an embodiment, the red color light emission efficiency of the organic light emitting display device 1000 may be increased by amplifying an intensity of the red color light.

Figure 3B:
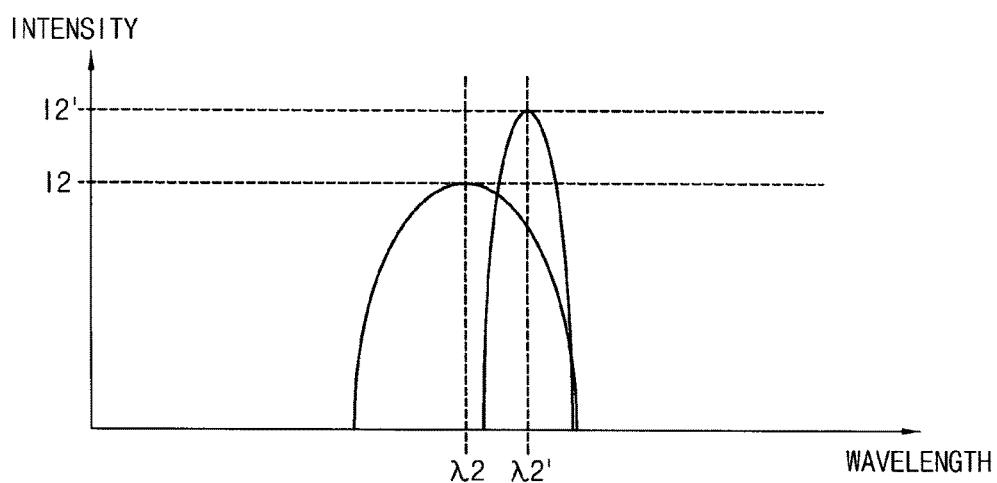

The second metamaterial layer 640 may be disposed corresponding to (e.g., overlapping) the second organic light emitting structure 440. In some exemplary embodiments, the second organic light emitting structure 440 may emit light that has a predetermined wavelength. The second metamaterial layer 640 may amplify an intensity of the light from the second organic light emitting structure 440. In one exemplary embodiment, for example, the second metamaterial layer 640 may emit the green color light, and may amplify an intensity of the green color light. As illustrated in FIG. 3B, the second organic light emitting structure 440 may emit the green color light that has a second light intensity I2 at a second wavelength λ2. The green color light having the second light intensity I2 at the second wavelength λ2 may be converted into the green color light having a converted (e.g., increased or improved) second light intensity I2' at an adjusted second wavelength λ2' by a resonance in the second metamaterial layer 640. Thus, in an exemplary embodiment, a green color coordinate of the organic light emitting display device 1000 may be compensated by adjusting the wavelength of the green color light and by decreasing a wavelength range of the green color light. In such an embodiment, the green color light emission efficiency of the organic light emitting display device 1000 may be increased by amplifying an intensity of the green color light.

Figure 3C:
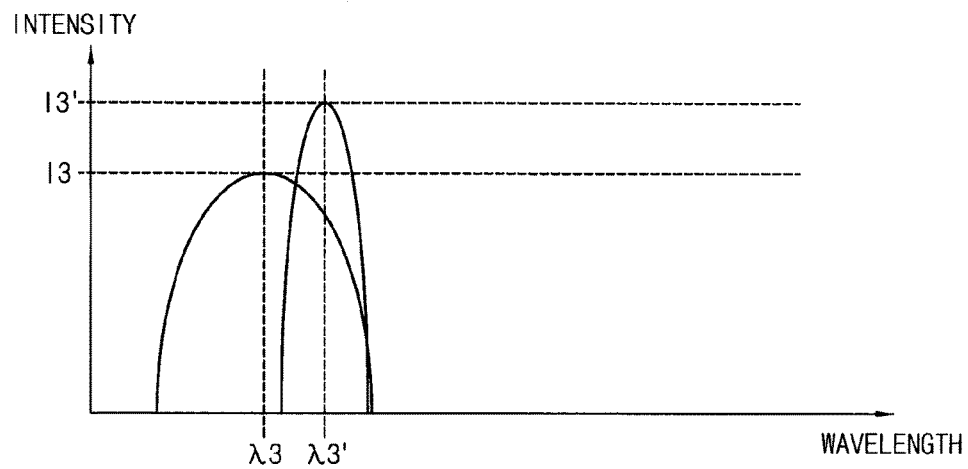

The third metamaterial layer 660 may be disposed corresponding to (e.g., overlapping) the third organic light emitting structure 460. In some exemplary embodiments, the third organic light emitting structure 460 may emit a light that has a predetermined wavelength. The third metamaterial layer 660 may amplify an intensity of the light that has the predetermined wavelength. In one exemplary embodiment, for example, the third metamaterial layer 660 may emit a blue color light, and may amplify an intensity of the blue color light. As illustrated in FIG. 3C, the third organic light emitting structure 460 may emit the blue color light that has a third light intensity I3 at a third wavelength λ3. The blue color light having the third light intensity I3 at the third wavelength λ3 may be converted into the blue color light having a converted (e.g., increased or improved) third light intensity I3' at an adjusted third wavelength λ3' by a resonance in the third metamaterial layer 660. Thus, in an exemplary embodiment, a blue color coordinate of the organic light emitting display device 1000 may be compensated by adjusting the wavelength of the blue color light and by decreasing a wavelength range of the blue color light. In such an embodiment, the blue color light emission efficiency of the organic light emitting display device 1000 may be increased by amplifying an intensity of the blue color light.

A black matrix may be disposed on the pixel defining layer 300 to effectively prevent the red color light, the green color light and the blue color light emitted from the first through third metamaterial layers 620, 640 and 660 from being mixed with each other.

The encapsulation member 700 may be disposed to cover the second electrode 500 and the first through third metamaterial layers 620, 640 and 660. In an exemplary embodiment, the encapsulation member 700 may effectively prevent oxygen and moisture penetration by encapsulating the first through third organic light emitting structures 420, 440 and 460 on the substrate. In such an embodiment, the encapsulation member 700 may protect the first through third organic light emitting structures 420, 440 and 460 from external impacts. The encapsulation member 700 may include an organic layer or an inorganic layer.

The second substrate 800 may be disposed on the encapsulation member 700 opposite to the first substrate 100. In one exemplary embodiment, for example, the second substrate 700 may be a glass substrate, a quartz substrate or a transparent plastic substrate. In an exemplary embodiment, the second substrate 700 may be a flexible substrate.

In an exemplary embodiment, as described above, the organic light emitting display device 1000 may include the first through third metamaterial layers 620, 640 and 660 corresponding to the first through third organic light emitting structures 420, 440 and 460. In such an embodiment, the red color light, the green color light and the blue color light that are emitted from the first through third organic light emitting structures 420, 440 and 460 may be amplified and/or adjusted because of the resonance in the first through third metamaterial layers 620, 640 and 660. Thus, in such an embodiment, the color coordinate of the organic light emitting display device 1000 may be, and the light emission efficiency of the organic light emitting display device 1000 may be increased.

Figure 4A:
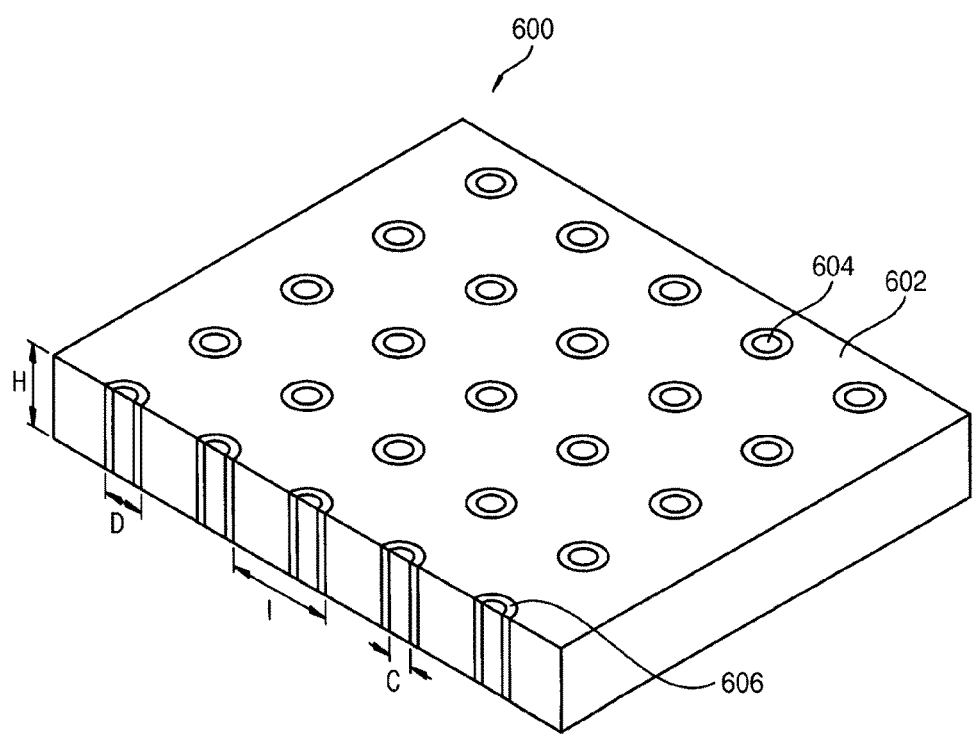
FIGS. 4A and 4B are perspective views illustrating exemplary embodiments of a metamaterial layer of FIG. 1.
Figure 4B:
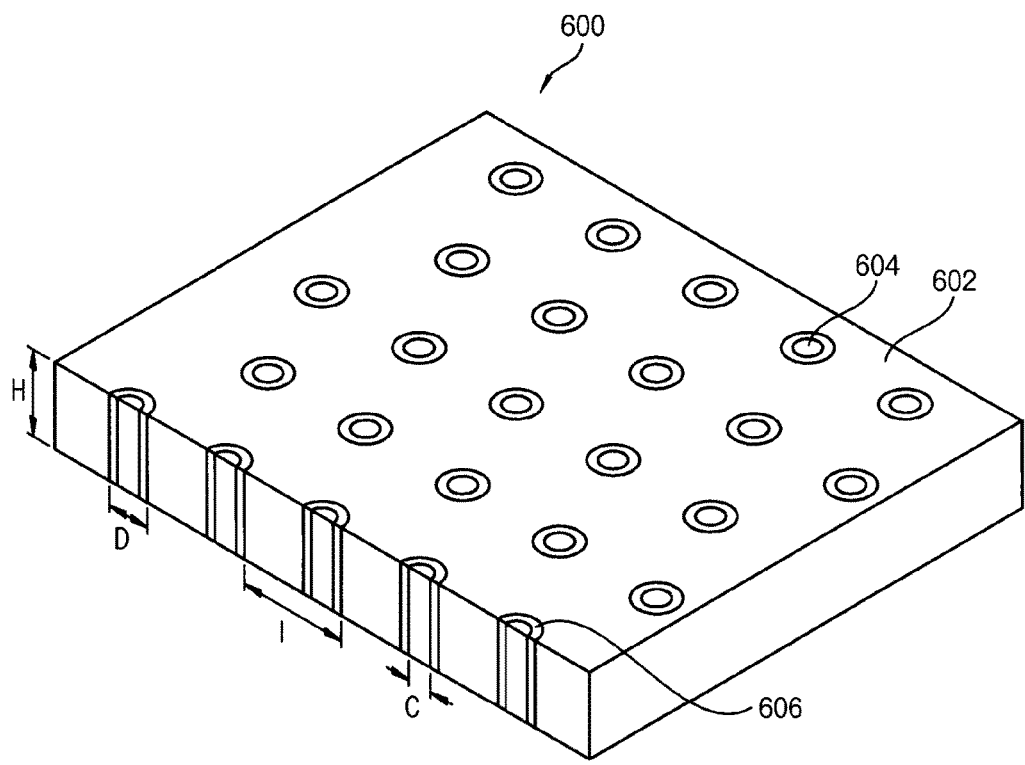

FIGS. 4A and 4B are perspective views illustrating exemplary embodiments of a metamaterial layer of FIG. 1.

Referring to FIGS. 4A and 4B, the metamaterial layer 600 may include a dielectric layer 602, a plurality of nano wires 604 and a coating layer 606. The dielectric layer 602 may have a substantially constant thickness H. In one exemplary embodiment, for example, the dielectric layer 602 may include silicon dioxide film, polymethylmethacrylate, polycarbonate, polyethyleneterephtalate or a combination thereof. A resonance wavelength in the metamaterial layer 600 may be changed based on the thickness H of the dielectric layer 602 and a dielectric constant of the dielectric layer 602. The plurality of nano wires 604 may be disposed in the dielectric layer 602. In such an embodiment, the nano wires 604 may extend substantially in a thickness direction of the dielectric layer and arranged at a regular interval I and penetrating the dielectric layer 602. The nano wires 604 may have a diameter C of several nanometers to several tens of nanometers. In an exemplary embodiment, as illustrated in FIG. 4A, the nano wires 604 may be arranged substantially in a rectangular lattice form. In an alternative exemplary embodiment, as illustrated in FIG. 4B, the nano wires 604 may be arranged substantially in a diamond lattice form. The nano wires 604 may include graphene or graphene oxide. The resonance wavelength in the metamaterial layer 600 may be changed according to the diameter C of the nano wires 604, the intervals I of the nano wires 604, and a material included in the nano wires 604 (e.g., a type or kind of the material). The coating layer 606 may be disposed between the nano wires 604 and the dielectric layer 602. In such an embodiment, the coating layer 606 may be coated on the nano wires 604. In one exemplary embodiment, for example, the coating layer 606 may include f argentums, aurum, aluminum, copper, nickel, platinum, titanium or a combination thereof. The resonance wavelength in the metamaterial layer 600 may be changed according to a diameter D of the coating layer 606 and a kind of material that forms the coating layer 606.

As described above, in an exemplary embodiment, the resonance wavelength in the metamaterial layer 600 may be changed according to a kind of a material that forms the nano wires 604 or coating layer 606, and the intervals of the nano wires 604.

Figure 5A:
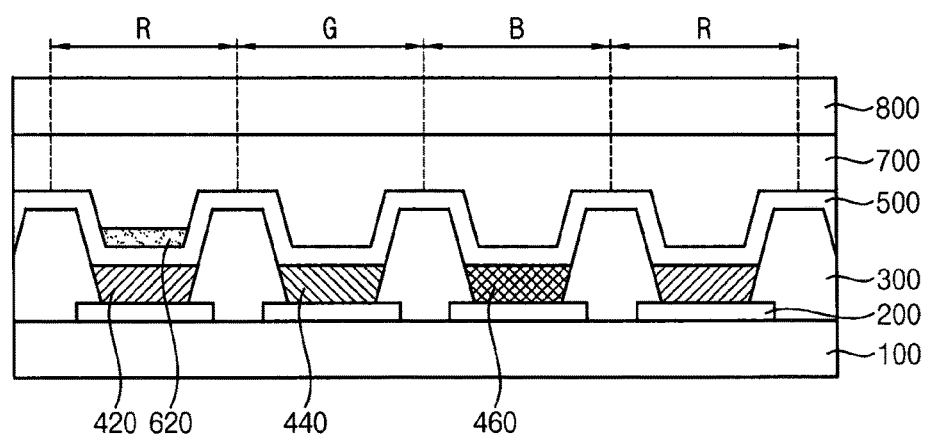
FIGS. 5A through 5C are cross-sectional views illustrating exemplary embodiments of an organic light emitting display device including a metamaterial layer disposed on an organic light emitting structure as shown in FIG. 1.
Figure 5B:
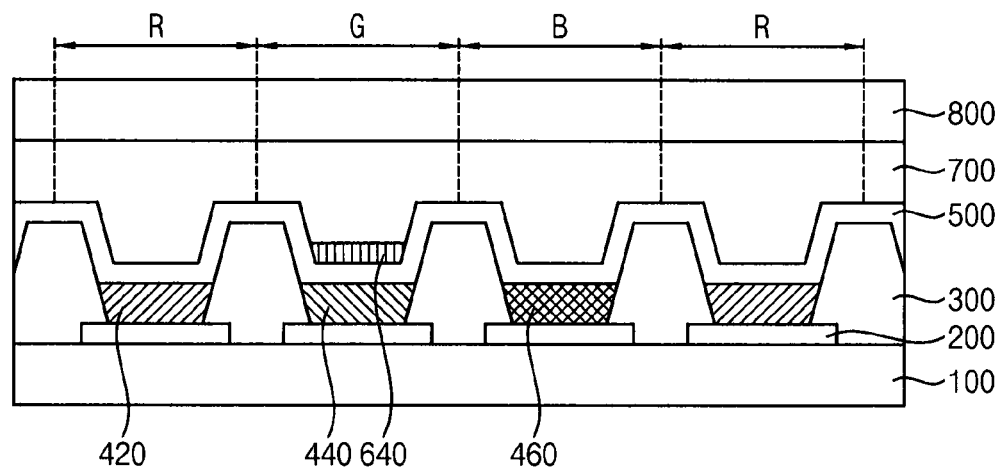
Figure 5C:
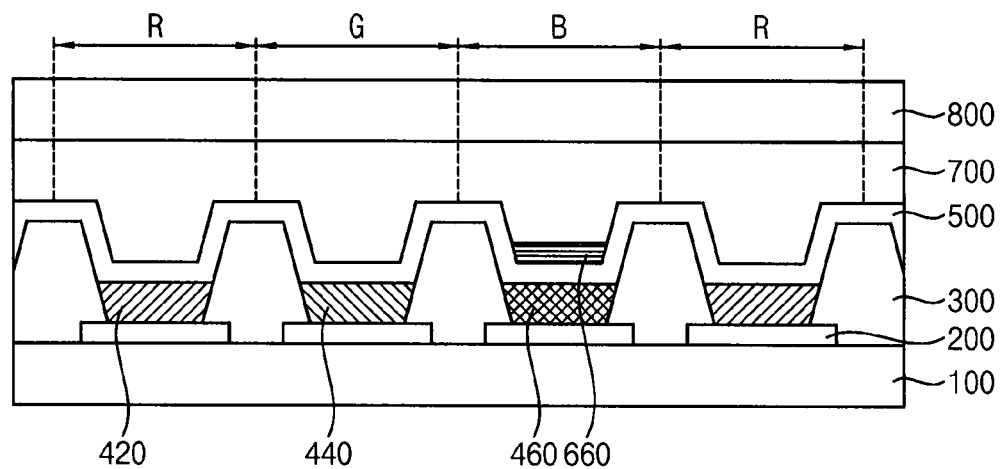

FIGS. 5A through 5C are cross-sectional views illustrating exemplary embodiments of an organic light emitting display device including a metamaterial layer disposed on an organic light emitting structure as shown in FIG. 1.

Referring to FIGS. 5A through 5C, a metamaterial layer may be disposed on a second electrode 500 corresponding to an organic light emitting structure, e.g., one of first through third organic light emitting structures 420, 440 and 460. As illustrated in FIG. 5A, in an exemplary embodiment, the metamaterial layer may include a first metamaterial layer 620 disposed corresponding to (e.g., overlapping) the first organic light emitting structure 420. In some exemplary embodiments, the first organic light emitting structure 420 may emit light having a predetermined wavelength. The first metamaterial layer 620 may amplify an intensity of the light from the first organic light emitting structure 420. In one exemplary embodiment, for example, the first organic light emitting structure 420 may emit a red color light, and the first metamaterial layer 620 may amplify an intensity of the red color light. As illustrated in FIG. 5B, in an exemplary embodiment, the metamaterial layer may include a second metamaterial layer 640 disposed corresponding to (e.g., overlapping) the second organic light emitting structure 440. In some exemplary embodiments, the second organic light emitting structure 440 may emit light having a predetermined wavelength. The second metamaterial layer 640 may amplify an intensity of the light from the second organic light emitting structure 440. In one exemplary embodiment, for example, the second organic light emitting structure 440 may emit a green color light, and the second metamaterial layer 640 may amplify an intensity of the green color light. As illustrated in FIG. 5C, in an exemplary embodiment, the metamaterial layer may include a third metamaterial layer 660 disposed corresponding to (e.g., overlapping) the third organic light emitting structure 460. In some exemplary embodiments, the third organic light emitting structure 460 may emit light having a predetermined wavelength. The third metamaterial layer 660 may amplify an intensity of the light from the third organic light emitting structure 460. In one exemplary embodiment, for example the third organic light emitting structure 460 may emit a blue color light, and the third metamaterial layer 660 may amplify an intensity of the blue color light.

As described above, in an exemplary embodiment, a metamaterial layer may be disposed corresponding to (e.g., overlapping) the first through third organic light emitting structures 420, 440 and 460 that emits light having a predetermined wavelength. In such an embodiment, the metamaterial layer may amplify an intensity of the light, such that a light emission efficiency of the organic light emitting display device 1000 may be increased.

Figure 6:
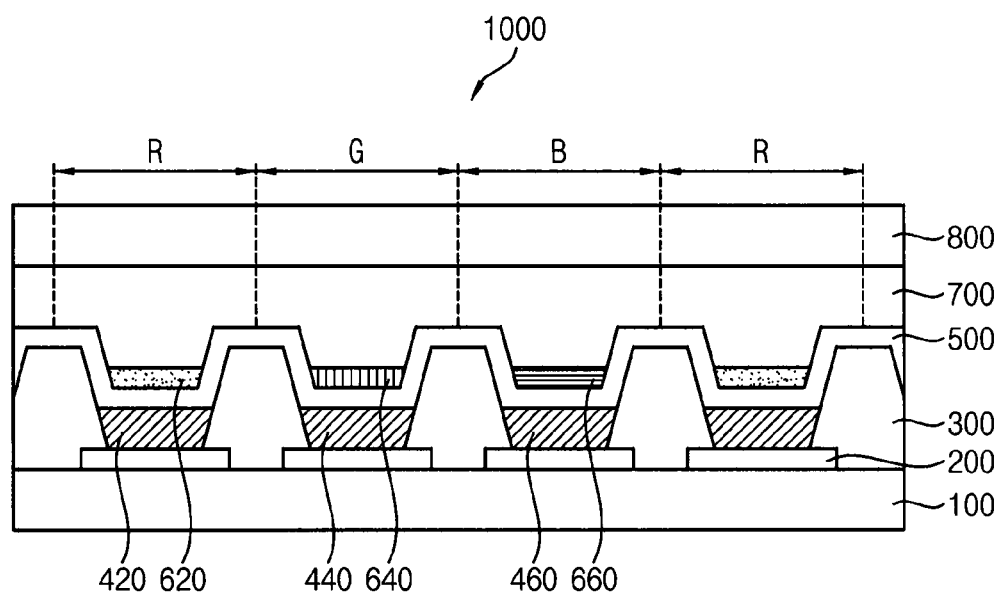
FIG. 6 is a cross-sectional view illustrating an alternative exemplary embodiment of an organic light emitting display device, according to the invention.
Figure 7:
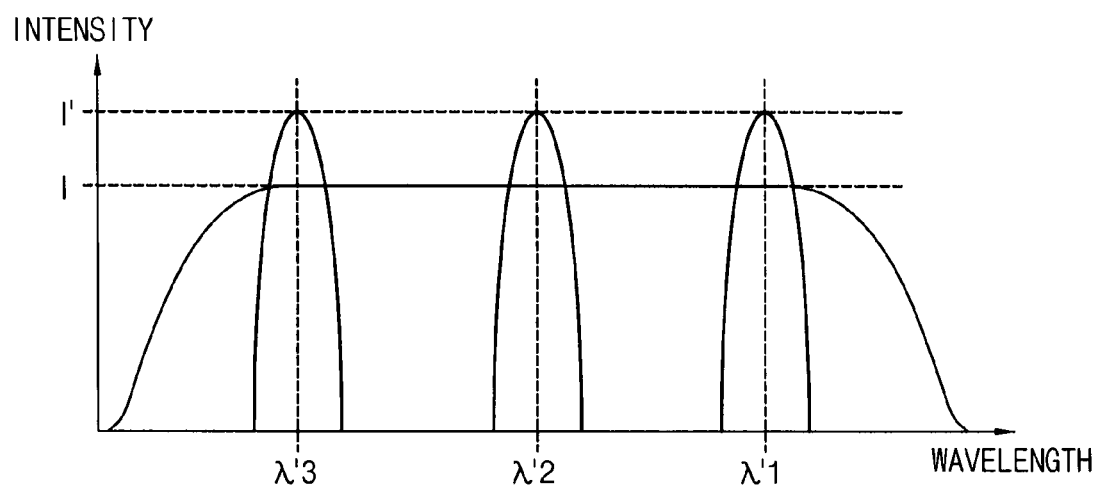
FIG. 7 is a graph for describing a change of light intensity by a metamaterial layer of FIG. 6.

FIG. 6 is a cross-sectional view illustrating an alternative exemplary embodiment of an organic light emitting display device, according to the invention, and FIG. 7 is a graph for describing a change of light intensity by a metamaterial layer of FIG. 6.

Referring to FIG. 6, an exemplary embodiment of the organic light emitting display device 1000 may include a first substrate 100, a first electrode 200, a pixel defining layer 300, first through third organic light emitting structures 420, 440 and 460, a second electrode 500, a metamaterial layer including first through third metamaterial layers 620, 640 and 660, an encapsulation member 700, and a second substrate 800.

In such an embodiment, the organic light emitting display device 1000 may include the first through third organic light emitting structures 420, 440 and 460 that emit first through third lights, respectively. The first through third lights may have substantially a same wavelength as each other, e.g., a predetermined wavelength. In one exemplary embodiment, for example, the first through third lights that are emitted from the first through third organic light emitting structures 420, 440, 460 may be a white color light. In some exemplary embodiments, the first metamaterial layer 620 may be provided or disposed corresponding to (e.g., overlapping) the first organic light emitting structure 420, the second metamaterial layer 640 may be disposed corresponding to (e.g., overlapping) the second organic light emitting structure 440, and the third metamaterial layer 660 may be disposed corresponding to (e.g., overlapping) the third organic light emitting structure 460. The first metamaterial layer 620 may convert the first light having the same wavelength into a red color light, the second metamaterial layer 640 may convert the second light having the same wavelength into a green color light, and the third metamaterial layer 660 may convert the third light having the same wavelength into a blue color light.

The first substrate 100 may include a transparent insulation substrate. In one exemplary embodiment, for example, the first substrate 100 may be a glass substrate, a quartz substrate or a transparent plastic substrate. In some exemplary embodiments, the first substrate 100 may be a flexible substrate. A plurality of transistors and capacitors may be disposed on the first substrate 100, and the first electrode 200 may be electrically coupled to the transistors. In one exemplary embodiment, for example, the first electrode 200 may be a transparent electrode or a semi-transparent electrode.

The pixel defining layer 300 that defines unit pixels may be disposed on the first substrate 100 and the first electrode 200. The pixel defining layer 300 may include various insulation materials. In an exemplary embodiment, openings that expose some portions of the first electrode 200 are defined in the pixel defining layer 300.

The first organic light emitting structure 420, the second organic light emitting structure 440 and the third light emitting structure 460 may be disposed on the exposed portion of the first electrode 200. In some exemplary embodiments, the first through third organic light emitting structures 420, 440 and 440 may respectively emit the first through third lights that have substantially the same wavelength as each other. In one exemplary embodiment, for example, the first through third lights may be the white color light. The first through third organic light emitting structures 420, 440 and 460 illustrated in FIG. 6 may be substantially the same as the first through third organic light emitting structures 420, 440 and 460 of the exemplary embodiment described in FIG. 2 except that the organic emitting layer 404 includes an organic light emitting material that emits the white color light.

The second electrode 500 may cover the pixel defining layer 300 and the first through third organic light emitting structures 420, 440 and 460. In one exemplary embodiment, for example, the second electrode 500 may be the transparent electrode or the semi-transparent electrode.

The first through third metamaterial layers 620, 640 and 660 may be disposed on the second electrode 500 corresponding to the first through third organic light emitting structures 420, 440 and 460, respectively. In some exemplary embodiments, the first metamaterial layer 620 may convert the first light having the same wavelength into the red color light, the second metamaterial layer 640 may convert the second light having the same wavelength into the green color light, and the third metamaterial layer 660 may convert the third light having the same wavelength into the blue color. As illustrated in FIG. 7, in such an embodiment, the first through third organic light emitting structures 420, 440 and 460 may respectively emit the white color light that has a light intensity I. The first light (i.e., white color light) having the light intensity I may be converted into the red color light having a converted (e.g., increased or improved) light intensity I' at an adjusted wavelength, e.g., a first wavelength $\lambda 1'$, by resonance in the first metamaterial layer 620. The second light (i.e., white color light) having the light intensity I may be converted into the green color light having a converted light intensity I' at an adjusted wavelength, e.g., a second wavelength $\lambda 2'$, by resonance in the second metamaterial layer 640. The third light (i.e., white color light) having the light intensity I may be converted into the blue color light having a converted light intensity I' at an adjusted wavelength, e.g., a third wavelength $\lambda 3'$, by resonance in the third metamaterial layer 660. In an exemplary embodiment, as shown in FIG. 7, the intensity of the red color light, the intensity of the green color light and the intensity of the blue color light may be the same as each other. In an alternative exemplary embodiment, the intensity of the red color light, the intensity of the green color light and the intensity of the blue color light may be different from each other according to a property of the first through third metamaterial layers 620, 640 and 660. The first through third metamaterial layers 620, 640 and 660 that are respectively disposed on the first through third organic light emitting structures 420, 440 and 460, each of which emits the white color lights, may perform substantially the same function as conventional color filters. The first through third metamaterial layers 620, 640 and 660 may decrease a loss of the lights that are emitted from the first through third organic light emitting structures 420, 440 and 460 compared with the conventional color filters. Thus, in an exemplary embodiment, a light emission efficiency of the organic light emitting display device 1000 may be increased.

The black matrix may be disposed on the pixel defining layer 300 to effectively prevent the red color light, the green color light and the blue color light emitted from the first through third metamaterial layers 620, 640 and 660 from being mixed.

The encapsulation member 700 may be disposed on the second electrode 500 and the first through third metamaterial layers 620, 640 and 660. The encapsulation member 700 may effectively prevent oxygen and moisture penetration by encapsulating the first through third organic light emitting structures 420, 440 and 460 that are disposed on the substrate. In such an embodiment, the encapsulation member 700 may protect the first through third organic light emitting structures 420, 440 and 460 from external impacts. The encapsulation member 700 may include an organic layer and an inorganic layer.

The second substrate 800 may be disposed on the encapsulation member 700 opposite to the first substrate 100. In one exemplary embodiment, for example, the second substrate 700 may be a glass substrate, a quartz substrate or a transparent plastic substrate. In an exemplary embodiment, the second substrate 700 may be a flexible substrate.

As described above, in an exemplary embodiment, the organic light emitting display device 1000 of FIG. 6 may include the first through third organic light emitting structures 420, 440 and 460 that emit the first through third lights, respectively. The first through third lights may have substantially the same wavelength as each other, e.g., a predetermined wavelength. The first and third metamaterial layers 620, 640 and 660 may be disposed corresponding to (e.g., overlapping) the first through third organic light emitting structures 420, 440 and 460. The first metamaterial layer 620 may convert the first light into the red color light, the second metamaterial layer 640 may convert the second light into the green color light, and the third metamaterial layer 660 may convert the third light into the blue color light. The first through third metamaterial layers 620, 640 and 660 may perform substantially the same function as conventional color filters. The first through third metamaterial layers 620, 640 and 660 may decrease the loss of the lights that are emitted from the first through third organic light emitting structures 420, 440 and 460 compared with the conventional color filters. Thus, in such an embodiment, light emission efficiency of the organic light emitting display device 1000 may be increased.

FIG. 8 is a flowchart illustrating an exemplary embodiment of a method of manufacturing an organic light emitting display device, according to the invention, and FIGS. 9A through 9G are cross-sectional views illustrating the method of FIG. 8.

Referring to FIG. 8, an exemplary embodiment of a method of manufacturing an organic light emitting display device may include providing, e.g., forming, a first electrode on a first substrate (S10), providing, e.g., forming, a pixel defining layer on the first substrate and the first electrode to define unit pixels (S20), and providing, e.g., forming, a first organic light emitting structure, a second organic light emitting structure and a third organic light emitting structure on the first electrode (S30). In such an embodiment, as shown in FIG. 8, the method may further include providing, e.g., forming, a second electrode covering the first through third organic light emitting structures and the pixel defining layer (S40), and providing, e.g., forming, a metamaterial layer corresponding to one of the first through third organic light emitting structures on the second electrode (S50). In such an embodiment, as shown in FIG. 8, the method may further include providing, e.g., forming, an encapsulation member that covers the second electrode and the metamaterial layer (S60), and providing, e.g., disposing, a second substrate on the encapsulation member opposite to the first substrate (S70).

Figure 9A:
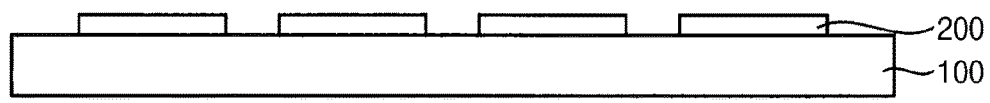
FIGS. 9A through 9G are cross-sectional views illustrating the method of FIG. 8.

In an exemplary embodiment, as illustrate in FIG. 9A, the first electrode 200 may be formed on the first substrate (S10). The first substrate 100 may include a transparent insulation substrate. In one exemplary embodiment, for example, the first substrate 100 may be a glass substrate, a quartz substrate, a transparent plastic substrate, etc. In some exemplary embodiments, the first substrate 100 may be a flexible substrate. A plurality of transistors and capacitors may be formed on the first substrate 100, and the first electrode 200 may be provided to be electrically coupled to the transistors. In some exemplary embodiments, where the first electrode 200 is a transparent electrode, the first electrode 200 may include a transparent conductive material such as indium tin oxide ("ITO"), tin oxide (SnOx), indium zinc oxide ("IZO") and gallium oxide (GaOx), for example. In other exemplary embodiments, where the first electrode 200 is a reflective electrode, the first electrode 200 may be formed by forming a layer using ITO, IZO, zinc tin oxide ("ZTO"), zinc oxide (ZnOx), tin oxide (SnOx), or a combination thereof, after forming a reflective layer using a material including argentums (Ag), magnesium (Mg), aluminum (Al), platinum (Pt), palladium (Pd), aurum (Au), chromium (Cr), tungsten (W), molybdenum (Mo), titanium (Ti) or a combination thereof.

Figure 9B:
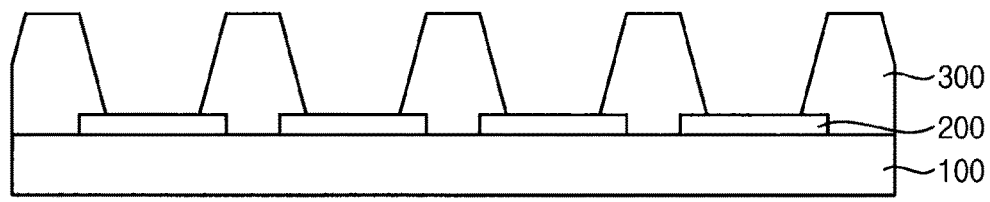

In such an embodiment, as illustrated in FIG. 9B, the pixel defining layer 300 may be formed on the first substrate 100 and the first electrode 200 to define unit pixels (S20). The pixel defining layer 300 may include various insulation materials. In such an embodiment, openings that expose some portions of the first electrode 200 may be formed in the pixel defining layer 300. In one exemplary embodiment, for example, the pixel defining layer 300 may be formed to have a multi-layer structure including an organic material, an inorganic material, or an organic-inorganic material. In one exemplary embodiment, for example, the inorganic material may include silicon oxide (SiOx), silicon nitride (SiNx), silicon oxynitride (SiON), or a combination thereof. In one exemplary embodiment, for example, the organic material may include an acrylic organic compound, polyamide, polyimide, or a combination thereof.

Figure 9C:
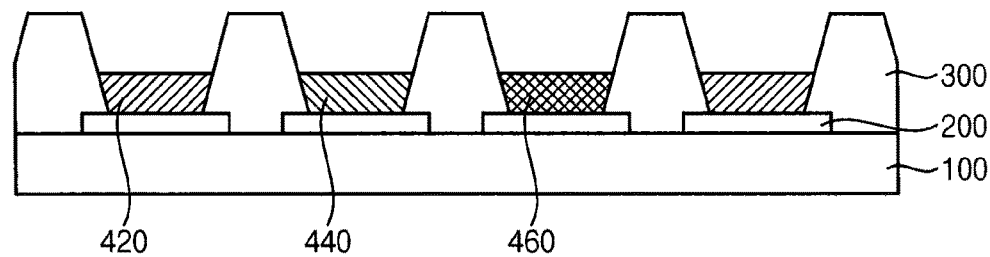

Referring to FIG. 9C, the first organic light emitting structure 420, the second organic light emitting structure 440 and the third organic light emitting structure 460 may be formed on the first electrode 200 (S30). The first through third organic light emitting structures 420, 440 and 460 may include a hole transfer layer, an organic light emitting layer and an electron injection layer. In such an embodiment, other layers may be disposed as necessary in addition to the hole transfer layer, the organic light emitting layer and the electron injection layer. In some exemplary embodiments, the first through third organic light emitting structures 420, 440 and 460 may emit light having predetermined wavelengths. The first organic light emitting structure 420 may emit a red color light, the second organic light emitting structure 440 may emit a green color light, and the third organic light emitting structure 460 may emit a blue color light. In one exemplary embodiment, for example, the organic light emitting layer of the first organic light emitting structure 420 may include an organic light emitting material that emits the red color light, the organic light emitting layer of the second organic light emitting structure 440 may include an organic light emitting material that emits the green color light, and the organic light emitting layer of the third organic light emitting structure 460 may include an organic light emitting material that emits the blue color light. In other exemplary embodiments, the first through third organic light emitting structures 420, 440 and 460 may emit the first through third lights that have a same wavelength as each other. The first through third organic light emitting structures 420, 440 and 460 may emit a white color light. In one exemplary embodiment, for example, the organic light emitting layer of the first through third organic light emitting structures 420, 440 and 460 may each include an organic light emitting material that emits the white color light.

Figure 9D:
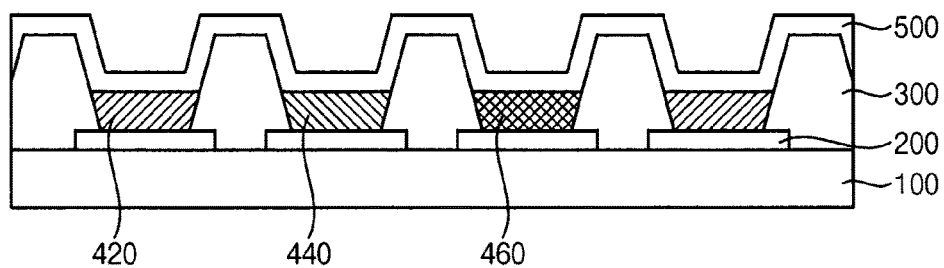

Referring to FIG. 9D, the second electrode 500 may be formed to cover the first through third organic light emitting structures 420, 440 and 460 and the pixel defining layer 300 (S40). In some exemplary embodiments, where the second electrode 500 is the transparent electrode, the second electrode 500 may include a transparent conductive material such as indium tin oxide, tin oxide, indium zinc oxide and gallium oxide, for example. In other exemplary embodiments, where the second electrode 500 is a reflective electrode, the second electrode 500 may be formed by forming a layer using ITO, IZO, ZTO, zinc oxide (ZnOx), tin oxide (SnOx), or a combination thereof, after forming the reflective layer using a material including argentums, magnesium, aluminum, platinum, palladium, aurum, chromium, tungsten, molybdenum, titanium or a combination thereof.

Figure 9E:
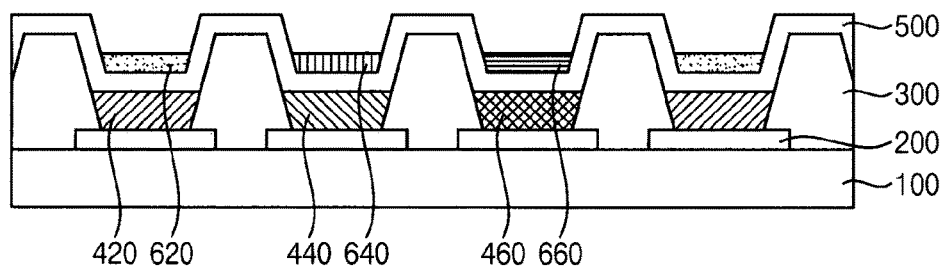

Referring to FIG. 9E, the metamaterial layer 620, 640 and 660 may be formed corresponding to (e.g., overlapping) one of the first through third organic light emitting structures 420, 440 and 460 on the second electrode 500 (S50). As described above, in such an embodiment, the metamaterial layer, e.g., each of the first through third metamaterial layers 620, 640 and 660, may include a plurality of nano wires that penetrates a dielectric layer and a coating layer in a thickness direction thereof. In one exemplary embodiment, for example, the dielectric layer may include silicon dioxide film, polymethylmethacrylate, polycarbonate, polyethyleneterephthalate or a combination thereof. The nano wires may include graphene, graphene oxide or a combination thereof. The coating layer may include a metal including argentums, aurum, aluminum, copper, nickel, platinum, titanium or a combination thereof. The resonance wavelength in the first through third metamaterial layers 620, 640 and 660 may be changed based on a kind of material that forms the nano wires and coating layer, and intervals of the nano wires. In some exemplary embodiments, the first organic light emitting structure 420 may emit the red color light, and the first metamaterial layer 620 that corresponds to the first organic light emitting structure 420 may amplify the intensity of the red color light. In some exemplary embodiments, the second organic light emitting structure 440 may emit the green color light, and the second metamaterial layer 640 that corresponds to the second organic light emitting structure 440 may amplify the intensity of the green color light. In some exemplary embodiments, the third organic light emitting structure 460 may emit the blue color light, and the third metamaterial layer 660 that corresponds to the second organic light emitting structure 460 may amplify the intensity of the blue color light. In other exemplary embodiments, the first through third organic light emitting structures 420, 440 and 460 may emit the first through third lights that have substantially the same wavelength as each other. The first metamaterial layer 620 may convert the first light to the red color light, the second metamaterial layer 640 may convert the second light to the green color light, and the third metamaterial layer 660 may convert the third light to the blue color light. In one exemplary embodiment, for example, the first through third light may be a white color light.

Figure 9F:
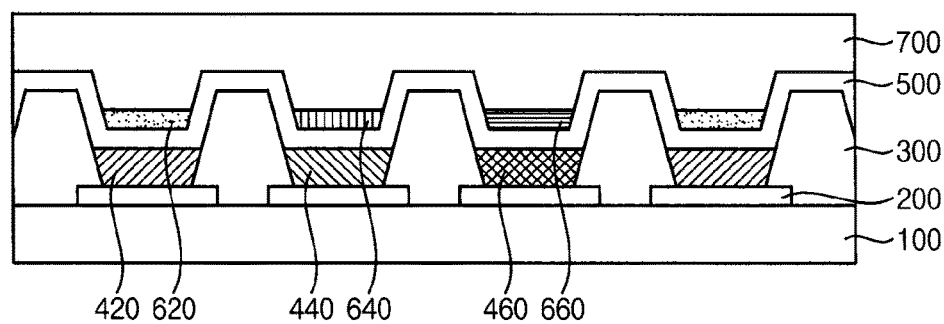

Referring to FIG. 9F, the encapsulation member 700 may be formed to cover the second electrode 500 and the first through third metamaterial layers 620, 640 and 660 (S60). The encapsulation member 700 may be formed with an organic layer and an inorganic layer. Each of the organic layer and the inorganic layer may have a multi-layer structure. In one exemplary embodiment, for example, the organic layer may include epoxy resin, acrylate resin, urethane acrylate resin or a combination thereof. The inorganic layer may include silicon nitride (SiNx), silicon oxide (SiOx), copper oxide (CuOx), iron oxide (FeOx), titanium oxide (TiOx), zinc selenium (ZnSe), aluminum oxide (AlOx) or a combination thereof.

Figure 9G:
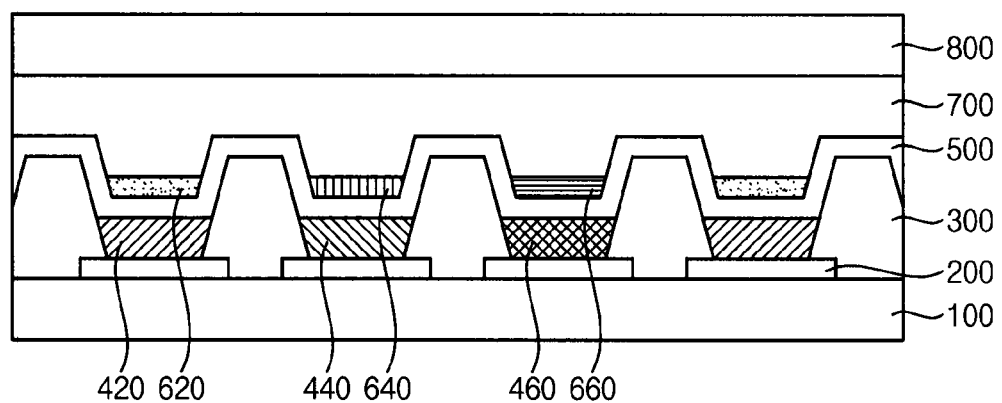

Referring to FIG. 9G, the second substrate 800 may be provided, e.g., disposed, on the encapsulation member 700 opposite to the first substrate 100 (S70). The second substrate 800 may include the flexible substrate, the glass substrate, the quartz substrate, the transparent plastic substrate, or a combination thereof.

As described above, in exemplary embodiment as set forth herein, a color coordinate of the organic light emitting display device 1000 may be compensated by the first through third metamaterial layers 620, 640 and 660 disposed on the second electrode 500 corresponding to the first through third organic light emitting structures 420, 440 and 460. In such embodiments, light emission efficiency of the organic light emitting display device 1000 may be increased.

Exemplary embodiments of the invention may be applied to a system including an organic light emitting display device. Exemplary embodiments of the invention may be applied to a computer monitor, a laptop, a digital camera, a cellular phone, a smart phone, a smart pad, a television, a personal digital assistant ("PDA"), a portable multimedia player ("PMP"), a MP3 player, a navigation system, a game console or a video phone, for example.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device comprising:
   a first substrate;
   a thin film transistor disposed on the first substrate;
   a first electrode electrically coupled to the thin film transistor;
   a pixel defining layer disposed on the first substrate and the first electrode to define unit pixels;
   a plurality of organic light emitting structures disposed on the first electrode, wherein the organic light emitting structures comprise a first organic light emitting structure, a second organic light emitting structure and a third light emitting structure;
   a second electrode which covers the first through third organic light emitting structures and the pixel defining layer;
   a metamaterial layer disposed on the second electrode corresponding to the organic light emitting structures;
   an encapsulation member which covers the second electrode and the metamaterial layer; and
   a second substrate disposed on the encapsulation member opposite to the first substrate.

2. The device of claim 1, wherein the metamaterial layer comprises:
   a first layer disposed corresponding to the first organic light emitting structure.

3. The device of claim 2, wherein
   the first organic light emitting structure emits light having a predetermined wavelength, and
   the first layer amplifies an intensity of the light having the predetermined wavelength.

4. The device of claim 3, wherein the light having the predetermined wavelength is one of a red color light, a green color light, and a blue color light.

5. The device of claim 2, wherein the metamaterial layer further comprises:
   a second layer disposed corresponding to the second organic light emitting structure.

6. The device of claim 1, wherein the metamaterial layer comprises:
   a first layer disposed corresponding to the first organic light emitting structure;
   a second layer disposed corresponding to the second organic light emitting structure; and
   a third layer disposed corresponding to the third organic light emitting structure.

7. The device of claim 6, wherein
   the first through third organic light emitting structures respectively emit first through third lights having a same wavelength as each other, and
   the first layer converts the first light having the same wavelength into a red color light,
   the second layer converts the second light having the same wavelength into a green color light, and
   the third layer converts the third light having the same wavelength into a blue color light.

8. The device of claim 7, wherein each of the first through third lights having the same wavelength is a white color light.

9. The device of claim 6, wherein
   the first organic light emitting structure emits a red color light,
   the second organic light emitting structure emits a green color light,
   the third organic light emitting structure emits a blue color light,
   the first layer amplifies an intensity of the red color light,
   the second layer amplifies an intensity of the green color light, and
   the third layer amplifies an intensity of the blue color light.

10. The device of claim 1, wherein the metamaterial layer comprises:
    a dielectric layer;
    a plurality of nano wires disposed in the dielectric layer, wherein the nano wires penetrate the dielectric layer in a thickness direction of the dielectric layer, and the nano wires are arranged at a regular interval; and
    a coating layer disposed between the nano wires and the dielectric layer.

11. The device of claim 10, wherein the dielectric layer comprises silicon dioxide, polymethylmethacrylate, polycarbonate, polyethyleneterephthalate or a combination thereof.

12. The device of claim 10, wherein the nano wires comprises graphene, graphene oxide or a combination thereof.

13. The device of claim 10, wherein the coating layer comprises argentums, aurum, aluminum, copper, nickel, platinum, titanium or a combination thereof.

* * * * *